United States Patent
Fukaya et al.

(10) Patent No.: US 9,618,838 B2
(45) Date of Patent: Apr. 11, 2017

(54) PHOTOMASK BLANK

(71) Applicant: Shin-Etsu Chemical Co., Ltd., Tokyo (JP)

(72) Inventors: Souichi Fukaya, Joetsu (JP); Yukio Inazuki, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 14/851,778

(22) Filed: Sep. 11, 2015

(65) Prior Publication Data
US 2016/0077424 A1 Mar. 17, 2016

(30) Foreign Application Priority Data
Sep. 12, 2014 (JP) .................. 2014-186313

(51) Int. Cl.
*G03F 1/50* (2012.01)
(52) U.S. Cl.
CPC ...................... *G03F 1/50* (2013.01)
(58) Field of Classification Search
CPC ................ G03F 1/50; G03F 1/08; G03F 1/14
USPC ............................................................ 430/5
See application file for complete search history.

(56) References Cited

U.S. PATENT DOCUMENTS

| | | | |
|---|---|---|---|
| 5,474,864 A | 12/1995 | Isao et al. | |
| 6,740,208 B2 * | 5/2004 | Kureishi | C23C 14/0052 |
| | | | 204/192.12 |
| 7,767,367 B2 | 8/2010 | Yoshikawa et al. | |
| 7,989,124 B2 | 8/2011 | Yoshikawa et al. | |
| 8,148,036 B2 | 4/2012 | Inazuki et al. | |
| 2002/0068228 A1 | 6/2002 | Kureishi et al. | |
| 2013/0273738 A1 | 10/2013 | Sakai et al. | |

FOREIGN PATENT DOCUMENTS

| | | |
|---|---|---|
| JP | 7-140635 A | 6/1995 |
| JP | 2007-241060 A | 9/2007 |
| JP | 2010-237499 A | 10/2010 |
| WO | WO 2006/085663 A1 | 8/2006 |

OTHER PUBLICATIONS

Extended European Search Report, dated Jun. 15, 2016, for European Application No. 15183315.9.

* cited by examiner

*Primary Examiner* — Christopher Young
(74) *Attorney, Agent, or Firm* — Birch, Stewart, Kolasch & Birch, LLP

(57) ABSTRACT

A photomask blank includes a chromium-based material film as a light-shielding film, wherein the chromium-based material film has an optical density per unit thickness at a wavelength of 193 nm of at least 0.050/nm, and the chromium-based material film has a tensile stress or compressive stress corresponding to an amount of warp of up to 50 nm.

The present invention provides a photomask blank having a thin film of chromium-based material which is lowered in film stress while retaining a high optical density per unit film thickness. This enables high-accuracy patterning of a chromium-based material film.

9 Claims, No Drawings

PHOTOMASK BLANK

CROSS-REFERENCE TO RELATED APPLICATION

This non-provisional application claims priority under 35 U.S.C. §119(a) on Patent Application No. 2014-186313 filed in Japan on Sep. 12, 2014, the entire contents of which are hereby incorporated by reference.

TECHNICAL FIELD

The present invention relates to a photomask blank as a raw material for a photomask used in the microfabrication of semiconductor integrated circuits, charge-coupled devices (CCD), liquid crystal display (LCD) color filters, magnetic heads or the like.

BACKGROUND ART

In the recent semiconductor processing technology, the trend toward higher integration of large-scale integrated circuits, particularly, places an increasing demand for miniaturization of circuit patterns. There are increasing demands for further reduction in size of circuit-constructing wiring patterns and for miniaturization of contact hole patterns for cell-constructing inter-layer connections. As a consequence, in the manufacture of circuit pattern-bearing photomasks for use in the photolithography of forming such wiring patterns and contact hole patterns, also, a technique which enables accurate writing of finer circuit patterns is needed to meet the miniaturization demand.

In order to form a higher accuracy photomask pattern on a photomask substrate, it is of first priority to form a high accuracy resist pattern on a photomask blank. Since the photolithography used in actually processing semiconductor substrates involves reduction projection, the photomask pattern has a size of about four times the actually needed pattern size, but the accuracy requirement is not moderated accordingly. The photomask serving as an original is rather required to have a higher accuracy than the pattern accuracy to be attained after exposure.

Further, in the currently prevailing lithography, a circuit pattern to be written has a feature size far smaller than the wavelength of light used. If a photomask pattern which is a mere four-time magnification of the circuit feature is used, a shape corresponding exactly to the photomask pattern is not transferred to the resist film, due to the influences of optical interference or the like occurring in the actual photolithography operation. To mitigate these influences, in some cases, the photomask pattern is required to be designed to a shape which is more complex than the actual circuit pattern, i.e., a shape which is obtained by application of the so-called optical proximity correction (OPC) or the like. Thus, at present, the lithography technology for obtaining photomask patterns also requires a higher accuracy processing method. The lithographic performance is sometimes represented by a maximum resolution. As to the resolution limit, the lithography involved in the photomask processing step is required to have a maximum resolution accuracy which is equal to or greater than the resolution limit necessary for the photolithography involved in the semiconductor processing step using a photomask.

From a photomask blank having an optical film (e.g., light-shielding film or phase shift film) on a transparent substrate, a photomask pattern is generally formed by coating a photoresist film on the blank, writing a pattern using electron beam, and developing to form a resist pattern. Using the resulting resist pattern as an etch mask, the optical film is then etched into an optical film pattern. In an attempt to miniaturize the optical film pattern, if processing is carried out while maintaining the thickness of the resist film at the same level as in the art prior to the miniaturization attempt, the ratio of film thickness to feature width, known as aspect ratio, becomes higher. As a result, the resist pattern profile is degraded to prevent effective pattern transfer, and in some cases, resist pattern collapse or peeling can occur. Therefore, the thickness of resist film needs to be reduced in accordance with the degree of miniaturization. However, as the resist film becomes thinner, the resist pattern is more susceptible to damage during dry etching of the optical film, undesirably resulting in a lowering of dimensional accuracy of a transferred pattern.

One known method of producing a high accuracy photomask using a thinner resist film involves forming a film separate from the optical film (e.g., light-shielding film or halftone phase shift film) as a processing-aid film. Specifically, a hard mask film is formed between the resist film and the optical film, the resist pattern is transferred to the hard mask film, and dry etching of the optical film is then carried out using the resulting hard mask pattern. JP-A 2007-241060 (Patent Document 1) discloses an exemplary method by which to form a finer pattern. With the intention to establish finer photolithography technology, a light-shielding film is formed of a material of a transition metal and silicon compound capable of shielding ArF excimer laser light despite a thinner film, and a chromium-based material film is used as the hard mask film for processing the light-shielding film, whereby higher accuracy processing becomes possible. Also, JP-A 2010-237499 (Patent Document 2) discloses a photomask of similar construction to Patent Document 1 wherein the hard mask film is of multilayer structure such that the stress introduced during deposition thereof may be mitigated for thereby preventing any drop of processing accuracy during preparation of a photomask.

CITATION LIST

Patent Document 1: JP-A 2007-241060
Patent Document 2: JP-A 2010-237499
Patent Document 3: JP-A H07-140635

DISCLOSURE OF INVENTION

According to the introduction of the immersion lithography, double patterning method or the like, life cycle of a technology of the photolithography using ArF excimer laser light is assuredly prolonged to the 20-nm node as the semiconductor processing criterion. There is a possibility that the ArF photolithography will be applied to still finer structures. For a photomask for forming such a fine pattern, the permissible error is naturally reduced and a high accuracy of patterning is necessary.

Besides, where a plurality of photomasks are used for forming a multilayer structure for devices, a high overlay accuracy is required. In addition, the overlay accuracy should be enhanced as the pattern miniaturization progresses.

Where a stress is generated in the light-shielding film, however, there arises the following problem. When patterning of a light-shielding film is conducted by subjecting a photomask blank to such steps as coating with a resist, exposure, development, etching, and stripping of the resist, the film stress existing in the light-shielding film is partly liberated, leading to the generation of strains. As a result, strains are generated in the photomask pattern which is obtained finally. If such strains are present in the photomask, the pattern position accuracy of the photomask is lowered.

As a method for reducing the film stress in a chromium-based material film, oxygen content of the film may be raised. An increase in the oxygen content, however, tends to raise transmittance. In order to obtain a desired optical density, therefore, an increase in film thickness is needed.

In the case of a fine pattern, an increase in the film thickness would raise the aspect ratio to such an extent as to cause such troubles as pattern collapse. Therefore, a thick light-shielding film is not suited to the manufacture of a photomask which needs fine processing.

Accordingly, an object of the present invention is to provide a photomask blank having a thin film of chromium-based material having a high optical density per unit film thickness and a low film stress for use as a light-shielding film or the like.

The inventors found that a photomask blank having a light-shielding film of a chromium-based material lowered in film stress while retaining a high optical density per unit film thickness can be provided when a chromium-based material film is used as a light-shielding film, the chromium-based material film has an optical density per unit film thickness at a wavelength of 193 nm of at least 0.050/nm, and when the chromium-based material film is formed on a quartz substrate having 152 mm square dimensions and 6.35 mm in thickness, and subjected to a heat treatment at a temperature of at least 150° C. for a time of at least 10 minutes, the chromium-based material film has a tensile stress or compressive stress corresponding to an amount of warp of up to 50 nm.

Accordingly, in one aspect, the present invention provides a photomask blank including a quartz substrate and a chromium-based material film formed on the quartz substrate, wherein the chromium-based material film is a light-shielding film, the chromium-based material film has an optical density per unit film thickness at a wavelength of 193 nm of at least 0.050/nm, and when the chromium-based material film is formed on a quartz substrate having 152 mm square dimensions and 6.35 mm in thickness, and subjected to a heat treatment at a temperature of at least 150° C. for a time of at least 10 minutes, the chromium-based material film has a tensile stress or compressive stress corresponding to an amount of warp of up to 50 nm.

In the photomask blank as above, preferably, the amount of warp is up to 30 nm.

In the photomask blank as above, preferably, the optical density per unit film thickness is at least 0.054/nm.

In the photomask blank as above, preferably, the chromium-based material film has a thickness of in a range of 4 nm to 50 nm.

In the photomask blank as above, preferably, the temperature of the heat treatment is up to 300° C.

In the photomask blank as above, preferably, the chromium-based material film contains at least one selected from the group consisting of nitrogen, oxygen, carbon and hydrogen.

In the photomask blank as above, preferably, the chromium-based material film is a CrN film.

In the photomask blank as above, preferably, the chromium-based film is a monolayer film.

Advantageous Effects of Invention

The present invention provides a photomask blank having a thin film of chromium-based material which is lowered in film stress while retaining a high optical density per unit film thickness. This enables high-accuracy patterning of a chromium-based material film. The use of the photomask blank of the invention and processing thereof into a photomask ensure that the resulting photomask can be used with enhanced reliability, specifically for lithography of up to 20 nm node.

DESCRIPTION OF PREFERRED EMBODIMENTS

The photomask blank of the present invention includes a quartz substrate and a light-shielding film formed on the quartz substrate. The light-shielding film is a chromium-based material film. In addition the chromium-based material film is characterized in that:

(i) the chromium-based material film has an optical density per unit film thickness at a wavelength of 193 nm of at least 0.050/nm, preferably at least 0.054/nm; and (ii) the chromium-based material film has a tensile stress or compressive stress corresponding to an amount of warp of the chromium-based material film of up to 50 nm, preferably up to 30 nm, when the chromium-based material film is formed on a quartz substrate having 152 mm square dimensions and 6.35 mm in thickness, and subjected to a heat treatment at a temperature of at least 150° C., preferably in a range of 150 to 300° C., for a time of at least 10 minutes.

If the film stress in a photomask blank is high, the film stress is partly liberated during processing of the photomask blank into a pattern, to generate strains in the photomask obtained finally. The strains would lower the pattern position accuracy of the photomask.

If the optical density per unit film thickness is low, the film thickness required for obtaining a desired optical density is large, so that such troubles as pattern collapse would occur at the time of film formation. The pattern collapse, if generated, makes it impossible to form a desired pattern in a thin film underlying the chromium-based material film.

The photomask blank of the present invention is provided with a chromium-based material film enhanced in optical density per unit film thickness and lowered in film stress. This photomask blank has a thinner chromium-based material film, whose pattern position accuracy is enhanced.

The chromium-based material film may be a multilayer film, but it is preferably a monolayer film. Besides, the thickness of the chromium-based material film is preferably in a range of 4 to 50 nm.

The chromium-based material film is preferably a chromium-based material film which contains at least one selected from the group consisting of nitrogen, oxygen, carbon and hydrogen. Especially preferred is a CrN film, namely, a film composed of chromium and nitrogen. In this case, the film preferably has a chromium content of 70 to 90 atom % and a nitrogen content of 10 to 30 atom %.

An increase in the oxygen content of the chromium-based material film can reduce film stress, but tends to lower the optical density per unit film thickness, which, in turn, increases the film thickness needed. On the other hand, an increase in chromium content enhances the optical density per unit film thickness, thereby reducing the film thickness required, but tends to increase the film stress. The chromium-based material film of the photomask blank of the present invention is formed to have a desired optical density and a desired film stress, by appropriately setting the conditions for film formation and the contents of light elements in the film.

The chromium-based material film to be used in the present invention may be formed by a sputtering method. The sputtering method may be either direct current (DC) sputtering or radio frequency (RF) sputtering, as described in JP-A H07-140635 (Patent Document 3), for example, and there may be employed any of those well-known methods. The target used is typically a chromium target although a chromium target containing nitrogen may also be used.

The sputtering is preferably reactive sputtering. As the sputtering gas, there may be used a combination of a well-known inert gas and a well-known reactive gas, specifically a combination of an inert gas such as argon gas (Ar gas) with a reactive gas such as nitrogen gas ($N_2$ gas), nitrogen oxide gas ($N_2O$ gas or $NO_2$ gas), oxygen gas ($O_2$ gas) and carbon oxide gas (CO gas or $CO_2$ gas). Particularly, where a CrN film is to be deposited, a combination of argon gas (Ar gas) as inert gas with nitrogen gas ($N_2$ gas) as reactive gas may be used, preferably with such an adjustment that the desired film composition can be obtained. Besides, in order to obtain a multilayer film, a film whose composition varies stepwise or continuously may be formed by performing deposition while the composition of the sputtering gas is changed stepwise or continuously, for example.

The gas pressure during film deposition may be appropriately set in consideration of the film stress, chemical resistance, cleaning resistance and the like of the resulting film. Chemical resistance is improved when the gas pressure is set to within a range of normally 0.01 to 1 Pa, particularly 0.03 to 0.3 Pa. The flow rates of gases may be appropriately determined so as to obtain the desired composition, and are ordinarily in a range of 0.1 to 100 sccm. In this case, the flow rate ratio of the reactive gas to the inert gas is preferably at least 1, and more preferably up to 2. Furthermore, the electric power impressed on the sputtering target may be appropriately set in consideration of the target size, cooling efficiency, ease of control of film deposition and the like; usually, the power per area of the sputtering surface of the target may be in a range of 0.1 to 10 $W/cm^2$.

The photomask blank of the present invention is suitable as a blank material for manufacture of a photomask to be used in photolithography in which ArF excimer laser light (wavelength: 193 nm) is employed for exposure.

EXAMPLES

The present invention will be described more specifically below referring to Examples and Comparative Examples, but not to be limited to the Examples.

Example 1

A chromium-based material film (44 nm thick) composed of CrN was deposited on a substrate by use of a DC sputtering system. Argon gas and nitrogen gas were used as sputtering gas in a flow rate ratio of Ar:$N_2$=1:1 (molar ratio), with such a control that the gas pressure inside the sputtering chamber would be 0.04 Pa. Using a Cr target, the deposition was conducted while rotating the substrate at 30 rpm.

For the chromium-based material film thus obtained, transmittance of ArF excimer laser (193 nm) was measured by use of phase shift/transmittance measurement system MPM193 (Lasertec Corp.), to determine optical density per unit film thickness. The optical density per unit film thickness is shown in Table 1 below.

Besides, the chromium-based material film obtained above was subjected to a heat treatment at 150° C. for 10 minutes. The amount of warp of the chromium-based material film upon the heat treatment was determined while using the amount of warp of the transparent substrate before the deposition of the chromium-based material film thereon as a reference. The amount of warp was measured using a flatness tester Tropel UltraFlat (Corning Tropel Corp.). The amount of warp is shown in Table 1. A positive value of the amount of warp represents that warpage is due to tensile stress, whereas a negative value of the amount of warp represents that warpage is due to compressive stress.

Example 2

A chromium-based material film (45 nm thick) composed of CrN was deposited on a substrate by use of a DC sputtering system. Argon gas and nitrogen gas were used as sputtering gas in a flow rate ratio of Ar:$N_2$=1:1.5 (molar ratio), with such a control that the gas pressure inside the sputtering chamber would be 0.05 Pa. Using a Cr target, the deposition was conducted while rotating the substrate at 30 rpm. For the chromium-based material film thus obtained, optical density per unit film thickness and the amount of warp were determined in the same manner as in Example 1. The results are set forth in Table 1.

Comparative Example 1

A chromium-based material film (43 nm thick) composed of CrN was deposited on a substrate by use of a DC sputtering system. Argon gas and nitrogen gas were used as sputtering gas in a flow rate ratio of Ar:$N_2$=2.5:2 (molar ratio), with such a control that the gas pressure inside the sputtering chamber would be 0.07 Pa. Using a Cr target, the deposition was conducted while rotating the substrate at 30 rpm. For the chromium-based material film thus obtained, optical density per unit film thickness and the amount of warp were determined in the same manner as in Example 1. The results are shown in Table 1.

Comparative Example 2

A chromium-based material film (44 nm thick) composed of CrON was deposited on a substrate by use of a DC sputtering system. Argon gas, nitrogen gas and oxygen gas were used as sputtering gas in a flow rate ratio of Ar:$N_2$:$O_2$=2.5:7.5:4 (molar ratio), with such a control that the gas pressure inside the sputtering chamber would be 0.13 Pa. Using a Cr target, the deposition was conducted while rotating the substrate at 30 rpm. For the chromium-based material film thus obtained, optical density per unit film thickness and the amount of warp were determined in the same manner as in Example 1. The results are set forth in Table 1.

TABLE 1

| | Optical density per unit film thickness [$nm^{-1}$] | Amount of warp [nm] |
|---|---|---|
| Comparative Example 1 | 0.055 | 103 |
| Example 1 | 0.054 | 31 |
| Example 2 | 0.052 | −3 |
| Comparative Example 2 | 0.042 | 10 |

In Comparative Example 1, the flow rate ratio of the reactive gas to the inert gas in depositing the chromium-based material film was lowered as aforementioned, whereby the optical density per unit film thickness was raised but the warpage was increased. On the other hand, in Comparative Example 2, the flow rate ratio of the reactive gases to the inert gas in depositing the chromium-based material film was raised, whereby the warpage was reduced but the optical density per unit film thickness was lowered. In contrast, Examples 1 and 2 produced chromium-based material films which are suitable for practical use in regard of both optical density per unit film thickness and the amount of warp.

The chromium-based material films obtained in Examples 1 and 2 make it possible to provide a photomask blank having a thin film of chromium-based material reduced in film stress while retaining a high optical density per unit film thickness. Consequently, patterning of a chromium-based material film with higher accuracy than in the related art can be achieved. In addition, the use of the photomask blank of the present invention and processing thereof into a photomask ensure that the resulting photomask can be used with enhanced reliability for lithography of up to 20 nm node.

Japanese Patent Application No. 2014-186313 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A photomask blank comprising:
a quartz substrate; and
a chromium-based material film formed on the quartz substrate, wherein
the chromium-based material film is a light-shielding film,
the chromium-based material film comprises at least one selected from the group consisting of nitrogen, oxygen, carbon and hydrogen,
the chromium-based material film has an optical density per unit film thickness at a wavelength of 193 nm of at least 0.050/nm, and
when the chromium-based material film is formed on a quartz substrate having 152 mm square dimensions and 6.35 mm in thickness, and subjected to a heat treatment at a temperature of at least 150° C. for a time of at least 10 minutes, the chromium-based material film has a tensile stress or compressive stress corresponding to an amount of warp of up to 50 nm.

2. The photomask blank of claim 1, wherein the amount of warp is up to 30 nm.

3. The photomask blank of claim 1, wherein the optical density per unit film thickness is at least 0.054/nm.

4. The photomask blank of claim 1, wherein the chromium-based material film has a thickness of in a range of 4 nm to 50 nm.

5. The photomask blank of claim 1, wherein the temperature of the heat treatment is up to 300° C.

6. The photomask blank of claim 1, wherein the chromium-based material film is a CrN film.

7. The photomask blank of claim 1, wherein the chromium-based film is a monolayer film.

8. The photomask blank of claim 6, wherein the CrN film has a chromium content of 70 to 90 atom % and a nitrogen content of 10 to 30 atom %.

9. The photomask blank of claim 1, wherein the chromium-based film is a multilayer film.

* * * * *